United States Patent
Ghilardelli

(10) Patent No.: US 8,503,242 B2
(45) Date of Patent: Aug. 6, 2013

(54) METHODS AND DEVICES FOR DETERMINING SENSING VOLTAGES

(75) Inventor: Andrea Ghilardelli, Cinisello Balsamo (IT)

(73) Assignee: Micron Technology, Inc., Boise, ID (US)

(*) Notice: Subject to any disclaimer, the term of this patent is extended or adjusted under 35 U.S.C. 154(b) by 137 days.

(21) Appl. No.: 13/086,984

(22) Filed: Apr. 14, 2011

(65) Prior Publication Data

US 2012/0262991 A1    Oct. 18, 2012

(51) Int. Cl.
*G11C 16/04* (2006.01)

(52) U.S. Cl.
USPC ............ 365/185.18; 365/185.24; 365/185.21; 365/185.2

(58) Field of Classification Search
USPC ............... 365/185.18, 185.24, 185.21, 185.2, 365/185.17, 185.03
See application file for complete search history.

(56) References Cited

U.S. PATENT DOCUMENTS

| | | | |
|---|---|---|---|
| 5,265,226 A | 11/1993 | Ueda | |
| 6,397,364 B1 | 5/2002 | Barkan | |
| 6,594,094 B2 | 7/2003 | Rae et al. | |
| 7,852,683 B2 * | 12/2010 | Lutze et al. | 365/185.24 |
| 2009/0287975 A1 | 11/2009 | Kim et al. | |
| 2011/0051513 A1 | 3/2011 | Shen et al. | |
| 2011/0280084 A1 | 11/2011 | Radke et al. | |
| 2012/0182810 A1 | 7/2012 | Radke et al. | |
| 2012/0240011 A1 | 9/2012 | Helm et al. | |

* cited by examiner

*Primary Examiner* — David Lam
(74) *Attorney, Agent, or Firm* — Brooks, Cameron & Huebsch, PLLC

(57) ABSTRACT

The present disclosure includes methods and devices for determining sensing voltages. One such method includes comparing data associated with a number of template distributions to data associated with a first threshold voltage distribution and a second threshold voltage distribution associated with a number of memory cells programmed to particular adjacent program states, determining an intersection of the first and second threshold voltage distributions based on a template distribution of the number template distributions which most closely compares to the first and second threshold voltage distributions, and using the determined intersection to determine a sensing voltage used to sense the number of memory cells programmed to the particular adjacent program states.

25 Claims, 3 Drawing Sheets

METHODS AND DEVICES FOR DETERMINING SENSING VOLTAGES

TECHNICAL FIELD

The present disclosure relates generally to semiconductor memory devices and methods, and more particularly, to methods and devices for determining sensing voltages.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target, e.g., desired, state. For example, electric charge can be placed on or removed from a charge storage structure of a memory cell to put the cell into one of a number of program states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen program states.

Sensing operations, e.g., read and/or program verify operations, can use sensing voltages to determine the state of flash memory cells. However, a number of mechanisms, such as read disturb, program disturb, and/or charge loss, e.g., charge leakage, can cause the stored charge on the charge storage structure, e.g., the threshold voltage (Vt), of the memory cells, to change. As a result of the change in the stored charge, previously used sensing voltages, e.g., sensing voltages used prior to the change in the stored charge occurs, may no longer provide accurate and/or reliable sensing of the memory cells. That is, previously used sensing voltages may result in an erroneous sensing of the memory cells when used during subsequent sensing operations. For example, the use of previous sensing voltages may result in a determination that the memory cells are in a state other than the target state, e.g., a state different than the target state to which the cell was programmed.

DETAILED DESCRIPTION

Figure 1:
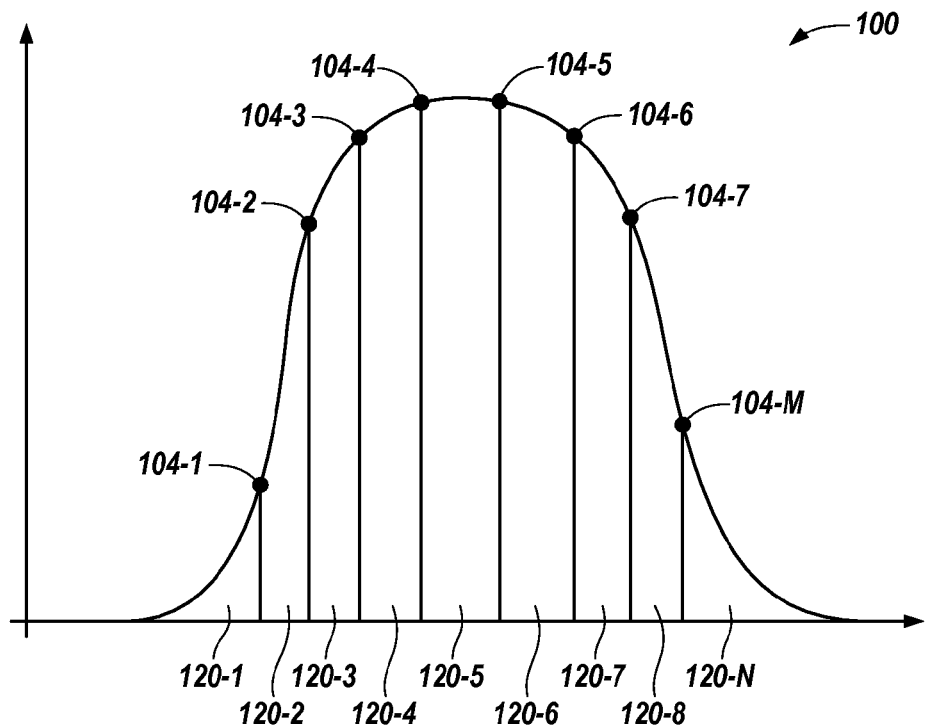
FIG. 1 is a graph illustrating a threshold voltage distribution in accordance with one or more embodiments of the present disclosure.

The present disclosure includes methods and devices for determining sensing voltages. One such method includes comparing data associated with a number of template distributions to data associated with a first threshold voltage distribution and a second threshold voltage distribution associated with a number of memory cells programmed to particular adjacent program states, determining an intersection of the first and second threshold voltage distributions based on a template distribution of the number template distributions which most closely compares to the first and second threshold voltage distributions, and using the determined intersection to determine a sensing voltage used to sense the number of memory cells programmed to the particular adjacent program states.

Threshold voltage distributions associated with memory cell program states can overlap due to programming window limitations, for instance. For example, as the memory cells are operated, e.g., programmed, read, and/or erased, the threshold voltage distribution associated with a given program state can deform and/or widen. The deformation and/or widening of the distribution can cause adjacent distributions to overlap. Overlapping threshold voltage distributions can cause bit errors when sensing, e.g., reading, the memory cells. For instance, because of the distribution overlap, it may not be possible to determine a sensing voltage capable of distinguishing between the overlapping distributions.

Sensing memory cells associated with overlapping threshold voltage distributions with a sensing voltage that corresponds to voltages at which the threshold distributions intersect can reduce the number of bit errors compared to sensing the memory cells with other sensing voltages. The voltages at which threshold distributions intersect can be determined using software, hardware, and/or firmware on a memory system controller and/or a host controller according to one or more embodiments of the present invention.

The number of bit errors can be reduced by sensing the memory cells that belong to overlapping threshold voltage distributions with a sensing voltage that corresponds to the voltage at which the distributions intersect because the greatest number of memory cells from the overlapping portion of the threshold voltage distributions can be assigned to the proper program state and/or voltage threshold distribution. Locating the intersection, e.g., an intersection point, between two threshold voltage distributions cannot be accomplished using only the data acquired when sensing a memory cell, e.g., hard data does not provide information regarding the shape of the distributions. The intersection between two voltage threshold distributions can be determined by comparing, e.g., cross-correlating and/or convoluting, data associated with two adjacent threshold voltage distributions associated with a number of memory cells programmed to particular adjacent program states with data associated with a number of template distributions. The threshold voltage distributions for a number of memory cells programmed to the adjacent program states can be determined by dividing the range of voltages associated with a distribution into a number of bins and determining the number of memory cells associated with each bin that fail.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N" and "M" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 117 may reference element "17" in FIG. 1, and a similar element may be referenced as 217 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a graph illustrating a threshold voltage distribution 100 in accordance with one or more embodiments of the present disclosure. The threshold voltage distribution 100 can be a threshold voltage distribution for a number of memory cells at one of a number of program states. The threshold voltage distribution 100 can overlap with another threshold voltage distribution (not shown). The threshold voltage distribution 100 can include a number of bins, 120-1, 120-2, 120-3, 120-4, 120-5, 120-6, 120-7, and 120-N. Each of the number of bins, 120-1, . . . , 120-N, can correspond to the threshold voltage of a number of memory cells. The number of memory cells associated with each bin corresponds to the number in the y value of data points 104-1, 104-2, 104-3, 104-4, 104-5, 104-6, 104-7, and 104-M. In FIG. 1, the number of memory cells associated with bins 120-1, 120-2, 120-3, 120-4, 120-5, 120-6, 120-7, and 120-8 correspond to the number in the y value of data points 104-1, 104-2, 104-3, 104-4, 104-5, 104-6, 104-7, and 104-M, respectively. The number of memory cells associated with each bin can be determined by sensing the number of memory cells with a sensing voltage that corresponds to the x value of data points the 104-1, 104-2, 104-3, 104-4, 104-5, 104-6, 104-7, and 104-M.

In one or more embodiments, threshold voltage distributions for memory cells programmed to a particular program state can be determined using soft data associated with the memory cells. The soft data associated with the memory cells can be determined during a sense operation performed on the memory cells. Soft data associated with a memory cell can indicate, for example, a location of a threshold voltage of the memory cell within a threshold voltage distribution representing the state to which the memory cell was programmed. Additionally, soft data can indicate a probability of whether the threshold voltage of a memory cell corresponds to the target state to which the memory cell was programmed.

In one or more embodiments, the number of data points forming a threshold voltage distribution can be greater than or equal to the number of data points forming the number of template distributions to be compared to the threshold voltage distribution. The data points forming a threshold voltage distribution can include a number of coordinates. The x value of the coordinate for a data point in the threshold voltage distribution can correspond to a voltage and the y value of the coordinate for a data point in the threshold voltage distribution can correspond to a number of memory cells. The data points 104-1, 104-2, 104-3, 104-4, 104-5, 104-6, 104-7, and 104-M associated with threshold voltage distribution 100 can be stored in the memory cells of a memory device, for example.

Figure 2:
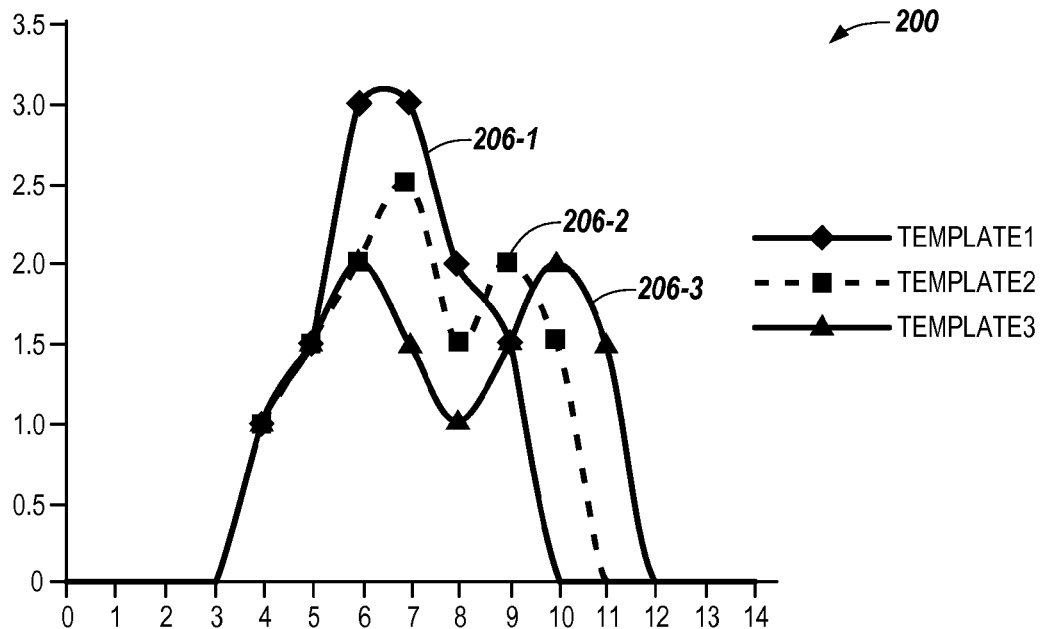
FIG. 2 is a graph illustrating a number of template distributions in accordance with one or more embodiments of the present disclosure.

FIG. 2 is a graph 200 illustrating a number of template distributions 206-1, 206-2, and 206-3 in accordance with one or more embodiments of the present disclosure. Template distributions can include the sum of one or more overlapping distributions that are substantially similar in shape to a threshold voltage distribution, such as threshold voltage distribution 100 shown in FIG. 1. The one or more distributions summed to form the template distributions can be Gaussian distributions, for example. However, the template distributions can have shapes other than Gaussian, in one or more embodiments.

In FIG. 2, template distributions 206-1, 206-2, and 206-3 include the sum of two overlapping distributions. The template distributions in FIG. 2 include three templates that each are formed from the sum of two distributions of varying overlap. Template distribution 206-1 is formed from the sum of two distributions with a first overlap. For example, the overlap of the distributions forming template distribution 206-1 can be the largest overlap of the three template distributions. Template distribution 206-2 is formed from the sum of two distributions with a second overlap. For example, the overlap of the distributions forming template distribution 206-2 can be the second largest overlap of the three template distributions. Template distribution 206-3 is formed from the sum of two distributions with a third overlap. For example, the overlap of the distributions forming template distribution 206-3 can be the smallest overlap of the three template distributions.

In one or more embodiments, multiple templates can be used for comparison to a threshold voltage distribution. The number of templates can include distributions with varying degrees of overlap. The values of the points forming the template distributions can be various values. The absolute values of the points forming the template distributions may not matter, only the shape of the distributions formed by the data points impact the comparison with a threshold voltage distribution in one or more embodiments.

In one or more embodiments, a template distribution can include a number of data points. For example, template distribution 206-1 in FIG. 2 can include 6 data points, template distribution 206-2 in FIG. 2 can include 7 data points, and template distribution 206-3 in FIG. 2 can include 8 data points. The number of data points in each template distribution can depend on the number of points used to illustrate the shape of the template distribution. The number of data points in the template distributions can be less than or equal to the number of data points in the threshold voltage distribution used in the comparison of the threshold voltage distribution and the template distributions. The data points forming the template distributions 206-1, 206-2, and 206-3 can be stored in the memory cells of a memory device.

Figure 3:
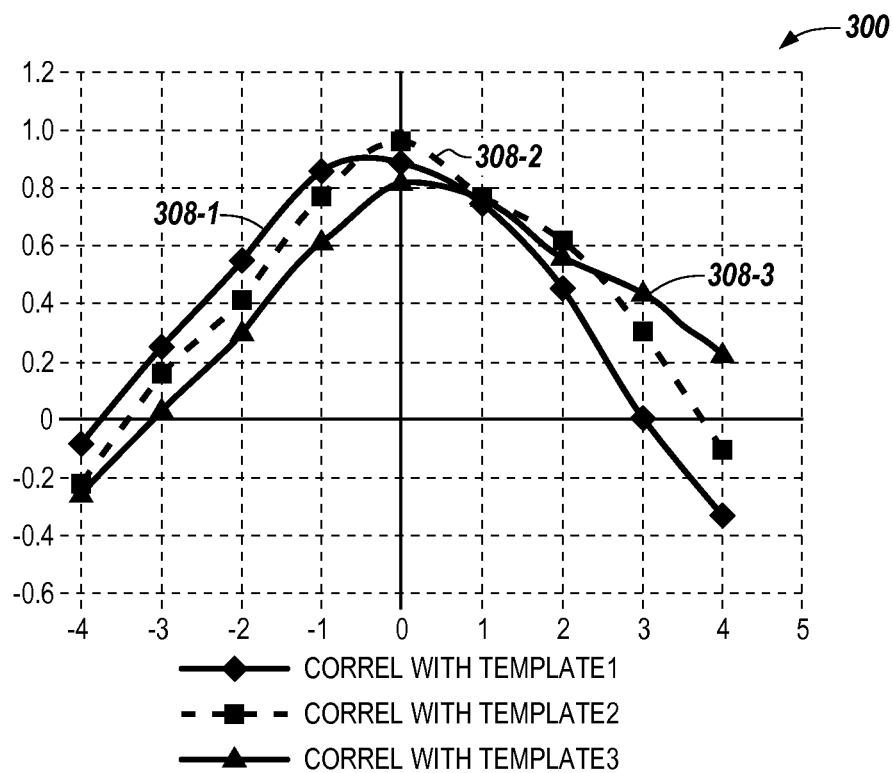
FIG. 3 is a graph illustrating the comparison of a threshold voltage distribution and a number of template distributions in accordance with one or more embodiments of the present disclosure.

FIG. 3 is a graph 300 illustrating the comparison of a threshold voltage distribution and a number of template distributions in accordance with one or more embodiments of the present disclosure. The comparison can use data associated with two threshold voltage distributions associated with a number of memory cells programmed to particular adjacent program states. The two threshold voltage distributions can be overlapping.

In one or more embodiments, the template that most closely correlates with threshold voltage distributions will be illustrated with the highest peak on a graph of the correlations.

In FIG. 3, the comparison illustrated includes the cross-correlation of the sum threshold voltage distribution 100 in FIG. 1 and another threshold voltage distribution with the template distributions 206-1, 206-2, and 206-3 in FIG. 2. Correlation with template 308-2 indicates that the threshold voltage distribution in FIG. 1 and another threshold voltage distribution are most closely correlated with template 206-2 because the peak of the correlation with template 308-2 is the highest. Template 206-2 included the second largest overlap between the two distributions forming template 206-2, therefore the voltage threshold distribution in FIG. 1 and another threshold voltage distribution have an overlap similar to the two distributions forming template 206-2.

The data points of template 206-2 and the data points of the threshold voltage distribution 100 in FIG. 1 and another threshold voltage distribution can be used to determine the intersection of the threshold voltage distribution 100 and another threshold voltage distribution. The intersection of the threshold voltage distribution 100 with another threshold voltage distribution can be used to determine the sensing voltage that can be used to sense memory cells programmed to the program state of the memory cells forming the threshold voltage distribution 100 and/or the memory cells forming another threshold voltage distribution that can overlap with threshold voltage distribution 100. The sensing voltage that can be used to sense memory cells programmed to the program state of the memory cells forming the threshold voltage distribution 100 can correspond to the x value of the intersection of the threshold voltage distribution 100 and another threshold voltage distribution. This sensing voltage can reduce the number of bit errors when sensing the memory cells forming the threshold voltage distribution 100 and/or another threshold voltage distribution.

In FIG. 3, correlation with template 308-1 indicates that the sum of threshold voltage distribution 100 and another threshold voltage distribution correlated less closely with template 206-1 than it correlated with template 206-2. Correlation with template 308-3 indicates that the sum of threshold voltage distribution 100 and another threshold voltage distribution correlated least closely with template 206-3 because correlation with template 308-3 had the lowest peak.

In one or more embodiments, cross-correlation can include using the data points from the threshold voltage distributions and the template distributions in the following equation:

$$correl(X, Y) = \frac{\sum (x - \bar{x})(y - \bar{y})}{\sqrt{\sum (x - \bar{x})^2 \sum (y - \bar{y})^2}}.$$

In one or more embodiments, convolution can be used to compare data associated with a number of template distributions to data associated with a threshold voltage distribution associated with a number of memory cells programmed to a particular state. The threshold voltage distributions can be defined as a function f and the template distributions can be defined as functions g(1), g(2), and g(3), for example. The convolution between the function f for the threshold distributions and the three template distributions, g(1), g(2), and g(3) can be calculated by solving the following equation:

$$(f * g)(n) = \sum_m f(m)g(n - m)$$

In one or more embodiments, the function g(1), g(2), and g(3) that produces the best convolution with the function f for the threshold voltage distributions is the template that most closely resembles overlapping threshold voltage distributions compared to the template distributions.

Figure 4:
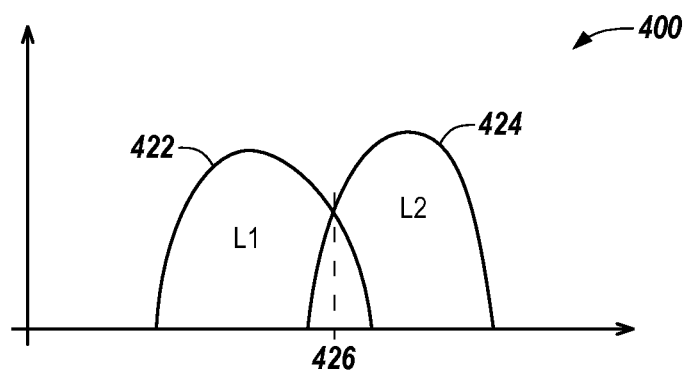
FIG. 4 is a graph illustrating intersecting threshold voltage distributions in accordance with one or more embodiments of the present disclosure.

FIG. 4 is a graph 400 illustrating intersecting threshold voltage distributions 422, 424 in accordance with one or more embodiments of the present disclosure. In FIG. 4, threshold voltage distribution 422 corresponds to memory cells programmed to program state L1 and threshold voltage distribution 424 corresponds to memory cells programmed to program state L2. Threshold voltage distribution 422 and threshold voltage distribution 424 intersect, as shown in FIG. 4. The location of the intersection between threshold voltage distribution 422 and threshold voltage distribution 424 can be determined in accordance with one or more embodiments of the present disclosure.

In one or more embodiments, threshold voltage distribution 422 can be determined by dividing the range of threshold voltages for the memory cells corresponding to the distribution into bins and determining the number of memory cells associated with each bin. The number of memory cells associated with each bin can be determined by sensing the memory cells with a voltage at the boundary of each bin and determining the number of memory cells that fail. Threshold voltage distribution 422 can also be determined using soft data acquired when sensing the memory cells in threshold voltage distribution 422.

In one or more embodiments, threshold voltage distribution 424 can be determined by dividing the range of threshold voltages for the memory cells corresponding to the distribution into bins and determining the number of memory cells associated with each bin. The number of memory cells associated with each bin can be determined by sensing the memory cells with a voltage at the boundary of each bin and determining the number of memory cells that fail. Threshold voltage distribution 424 can also be determined using soft data acquired when sensing the memory cells in threshold voltage distribution 424.

Once threshold voltage distributions 422 and 424 are determined, the sum of threshold voltage distribution 422 and threshold voltage distribution 424 can be compared to a number of template distributions, e.g., template 206-1, template 206-2, and template 206-3 from FIG. 2, using cross-correlation and/or convolution. The comparison between the sum of the threshold voltage distributions and the number of templates can determine which of the number of templates most closely compares to threshold voltage distributions 422 and 424. The data points from threshold voltage distributions 422 and 424 and the template distribution that most closely compared to threshold voltage distributions 422 and 424 can be used to determine where the intersection between threshold voltage distribution 422 and threshold voltage distribution 424 occurs. The data points associated with threshold voltage distributions 422 and 424 and the template distributions can be stored in the memory cells of a memory device. The intersection between threshold voltage distribution 422 and threshold voltage distribution 424 can identify a voltage 426 that can be used as a sensing voltage for sensing the memory cells in threshold voltage distribution 422 and/or the memory cells in threshold voltage distribution 424. Sensing the memory cells in threshold voltage distribution 422 with voltage 426 can reduce the number bit errors that occur when sensing the memory cells threshold voltage distribution 422. Sensing the memory cells in threshold voltage distribution 424 with voltage 426 can reduce the number bit errors that occur when sensing the memory cells threshold voltage distribution 424.

Figure 5:
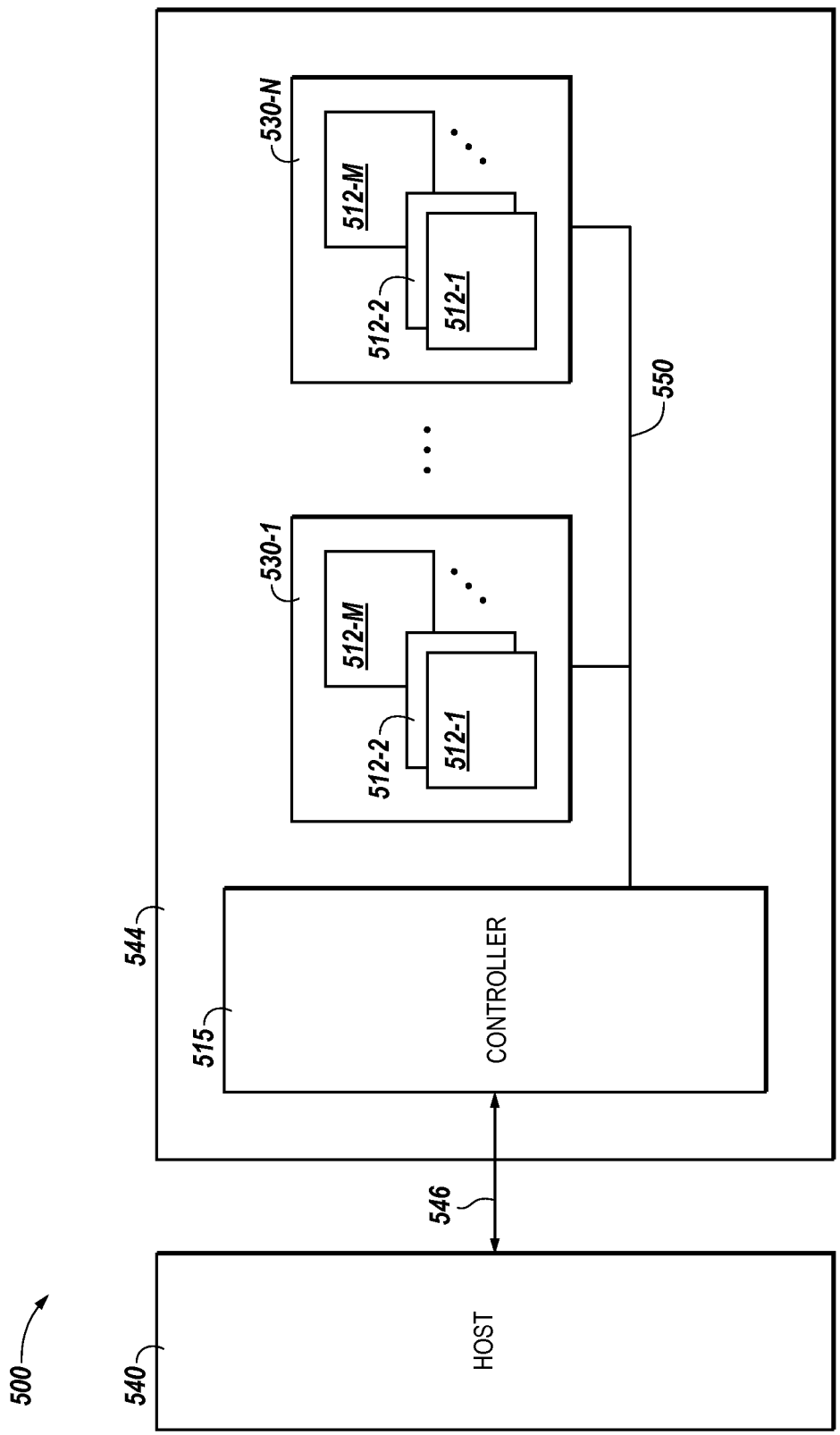
FIG. 5 is a functional block diagram of a computing system including at least one memory system in accordance with one or more embodiments of the present disclosure.

FIG. 5 is a functional block diagram of a computing system 500 including at least one memory system 544, in accordance with one or more embodiments of the present disclosure. In the embodiment illustrated in FIG. 5, the memory system 544 can include a controller 515 and one or more memory devices 530-1, . . . , 530-N coupled via bus 550. In this example, the controller 515 is external to the one or more memory devices 530-1, . . . , 530-N. The memory devices 530-1, . . . , 530-N can provide a storage volume for the memory system, e.g., with a file system formatted to the memory devices. The controller 515 can include control circuitry, e.g., hardware, firmware, and/or software. Sensing voltages can be determined using software, hardware, and/or firmware on controller 515 and/or on host 540 according to one or more embodiments of the present invention. In one or more embodiments, the controller 515 can be an application specific integrated circuit (ASIC) coupled to a printed circuit board including a physical interface and memory devices 530-1, . . . , 530-N.

As illustrated in FIG. 5, a host 540 can be coupled to the memory system 544. Host 540 can be a laptop computer, personal computer, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

In one or more embodiments, a physical host interface 546 can be in the form of a standardized interface. For example, when the memory system 544 is used for data storage in a computing system 500, physical host interface 546 can be a serial advanced technology attachment (SATA), peripheral component interconnect express (PCIe), or a universal serial bus (USB), among other connectors and interfaces. In general, however, a physical host interface 546 can provide an interface for passing control, address, data, and other signals between the memory system 544 and a host 540 having compatible receptors for the physical host interface.

The controller 515 can communicate with the memory devices 530-1, . . . , 530-N to read, write, and erase data, among other operations. Controller 515 can have circuitry that may be one or more integrated circuits and/or discrete components. A memory controller could selectively couple an I/O connection (not shown in FIG. 1) of a memory device 530-1, . . . , 530-N to receive the appropriate signal at the appropriate I/O connection at the appropriate time. Similarly, the communication protocol between a host 540 and the memory system 544 may be different than what is required for access of a memory device 530-1, . . . , 530-N. Controller 515 could then translate the commands received from a host 540 into the appropriate commands to achieve the desired access to a memory device 530-1, . . . , 530-N.

A memory device 530-1, . . . , 530-N can include one or more arrays of memory cells 512-1, 512-2, 512-M, e.g., non-volatile memory cells. The arrays 512-1, 512-2, 512-M can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 5 can include additional circuitry that is not illustrated so as not to obscure embodiments of the present disclosure. For example, the memory system 544 can include address circuitry to latch address signals provided over I/O connections through I/O circuitry. Address signals can be received and decoded by a row decoder and a column decoder to access the memory devices 530-1, . . . , 530-N. It will be appreciated by those skilled in the art that the number of address input connections can depend on the density and architecture of the memory devices 530-1, . . . , 530-N.

In general, the controller 515 is responsible for converting command packets received from the host 540, e.g., from a PCIe bus, into command instructions for host-memory translation circuitry and for converting memory responses into host system commands for transmission to the requesting host.

CONCLUSION

The present disclosure includes methods and devices for determining sensing voltages. One such method includes comparing data associated with a number of template distributions to data associated with a first threshold voltage distribution and a second threshold voltage distribution associated with a number of memory cells programmed to particular adjacent program states, determining an intersection of the first and second threshold voltage distributions based on a template distribution of the number template distributions which most closely compares to the first and second threshold voltage distributions, and using the determined intersection to determine a sensing voltage used to sense the number of memory cells programmed to the particular adjacent program states.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for determining a sensing, voltage, comprising:
   comparing data associated with a number of template distributions to data associated with a first threshold voltage distribution and a second threshold voltage distribution associated with a number of memory cells programmed to particular adjacent program states;
   determining an intersection of the first and second threshold voltage distributions based on a template distribution of the number template distributions which most closely compares to the first and second threshold voltage distributions; and
   using the determined intersection to determine a sensing voltage used to sense the number of memory cells programmed to the particular adjacent program states.

2. The method of claim 1, wherein each of the number of template distributions have at least 6 data points.

3. The method of claim 1, wherein comparing data associated with the number of template distributions to data associated with the first threshold voltage distribution and the second threshold voltage distribution includes cross-correlating the data associated with the number of template distributions and the data associated with the first threshold voltage distribution and the second threshold voltage distribution.

4. The method of claim 1, wherein comparing data associated with the number of template distributions to data associated with the first threshold voltage distribution and the second threshold voltage distribution includes convoluting the data associated with the number of template distributions and the data associated with the first threshold voltage distribution and the second threshold voltage distribution.

5. The method of claim 1, wherein the first threshold voltage distribution includes at least 6 data points and second threshold voltage distribution includes at least 6 data points.

6. The method of claim 1, wherein the sensing voltage used to sense the number of memory cells programmed to the particular adjacent program states reduces bit errors when used to sense the number of memory cells.

7. A method for determining a sensing voltage, comprising:
   determining a first threshold voltage distribution by sensing soft data associated with a number of memory cells;
   determining a second threshold voltage distribution by sensing soft data associated with a number of memory cells
   cross-correlating data associated with a number of template distributions to data associated with the first and second threshold voltage distributions;
   determining which of the number of template distributions most closely correlates to the first and second threshold voltage distributions; and
   determining an intersection of the first and second threshold voltage distributions based on the template distribution which most closely correlates to the first and second threshold voltage distributions.

8. The method of claim 7, wherein the number of template distributions and the first and second threshold voltage distributions each have a substantially similar number of data points.

9. The method of claim 7, wherein the number of template distributions include at least two template distributions with varying overlap between two adjacent distributions forming the at least two template distributions.

10. The method of claim 7, further including storing information associated with the number of template distributions and the first and second threshold voltage distributions in memory cells.

11. The method of claim 7, wherein the method includes sensing memory cells with a voltage corresponding to the intersection of the first and second threshold voltage distributions.

12. The method of claim 7, wherein the method includes determining a sensing voltage used to sense the number of memory cells based on the intersection of the first and second threshold voltage distributions.

13. A method for determining a sensing voltage, comprising:
   sensing a number of memory cells with a number of sensing voltages over a range of voltages;
   determining a number of memory cells that fail when sensed using each of the number of sensing voltages;
   determining a first threshold voltage distribution and a second threshold voltage distribution based on the number of memory cells determined to have failed;
   creating a number of template distributions, wherein each of the number of template distributions is a sum of two distributions that overlap by varying amounts;
   cross-correlating data associated with a number of template distributions to data associated with the first and second threshold voltage distributions; and
   determining which of the number of template distributions most closely correlates to the first and second threshold voltage distributions.

14. The method of claim 13, wherein the range of voltages includes the range of threshold voltages for the number of memory cells programmed to particular adjacent program states.

15. The method of claim 13, wherein sensing the number of memory cells with the number of sensing voltages over the range of voltages includes sensing the number of memory cells with at least 12 sensing voltages.

16. The method of claim 13, including storing data points from the number of template distributions and the first and second threshold voltage distributions in memory.

17. The method of claim 13, including:
   determining an intersection of the first and second threshold voltage distributions based on the template distribution which most closely correlates to the first and second threshold voltage distributions; and determining a sensing voltage used to sense memory cells programmed to the state of the memory cells forming the first and second threshold voltage distributions based on the intersection.

18. A device, comprising:
a controller configured to:
compare data associated with a number of template distributions to data associated with a first threshold voltage distribution and a second threshold voltage distribution;
determine which of the template distributions most closely compares to the first and second threshold voltage distributions; and
determine an intersection of the first and second threshold voltage distributions based on the template distribution which most closely correlates to the first and second threshold voltage distributions.

19. The device of claim 18, wherein the intersection is used to determine a sensing voltage used to sense memory cells programmed to a program state for the memory cells forming the first threshold voltage distribution.

20. The device of claim 18, wherein the number of template distributions and the first and second threshold voltage distributions each have a substantially similar number of data points.

21. The device of claim 18, wherein the number of template distributions include at least two template distributions with varying overlap between two overlapping distributions forming the three template distributions.

22. The device of claim 18, wherein memory cells forming the first threshold voltage distribution are sensed using a voltage corresponding to the intersection of the first and second threshold voltage distributions.

23. A device, comprising:
an array of memory cells; and
a controller coupled to the array and configured to:
determine a first threshold voltage distribution and a second threshold voltage distribution based on a number of memory cells that fail when sensed with each of a number of sensing voltages;
create a number of template distributions, wherein each of the number of template distributions is a sum of two distributions that overlap by varying amounts;
cross-correlate data associated with the number of template distributions to data associated with the first and second threshold voltage distributions; and
determine which of the number of template distribution that most closely correlates to the first and second threshold voltage distributions.

24. The device of claim 23, wherein the controller is configured to:
determine an intersection of the first and second threshold voltage distributions based on the template distribution which most closely correlates to the first and second threshold voltage distributions; and
determine a sensing voltage used to sense memory cells programmed to the program state of the memory cells forming the first threshold voltage distribution based on the intersection.

25. The device of claim 23, wherein the controller coupled to the array is included in a memory controller.

* * * * *